US009723764B2

(12) United States Patent
Sugita

(10) Patent No.: US 9,723,764 B2
(45) Date of Patent: Aug. 1, 2017

(54) STACK UNIT

(71) Applicant: Toyota Jidosha Kabushiki Kaisha, Toyota-shi, Aichi-ken (JP)

(72) Inventor: Masayuki Sugita, Miyoshi (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 33 days.

(21) Appl. No.: 14/978,474

(22) Filed: Dec. 22, 2015

(65) Prior Publication Data

US 2016/0192539 A1 Jun. 30, 2016

(30) Foreign Application Priority Data

Dec. 24, 2014 (JP) .................................. 2014-259798

(51) Int. Cl.
H05K 7/20 (2006.01)
(52) U.S. Cl.
CPC .............................. H05K 7/20927 (2013.01)
(58) Field of Classification Search
CPC ...... H01H 9/52; H01L 23/473; H05K 7/1432; H05K 7/2089–7/20272
USPC ......................................................... 361/716
See application file for complete search history.

(56) References Cited

U.S. PATENT DOCUMENTS

| 5,091,824 | A * | 2/1992 | Dzwonczyk | ......... | H05K 7/1424 |
| | | | | | 165/80.4 |
| 6,542,365 | B2 * | 4/2003 | Inoue | ................. | H01L 23/4006 |
| | | | | | 165/80.4 |
| 8,537,551 | B2 * | 9/2013 | Ide | ...................... | H01L 23/4334 |
| | | | | | 257/706 |
| 9,219,425 | B2 * | 12/2015 | Sano | ..................... | H02M 7/003 |
| 9,307,681 | B2 * | 4/2016 | Kogure | ................ | F16L 41/088 |
| 2005/0259402 | A1 * | 11/2005 | Yasui | .................... | H02M 7/003 |
| | | | | | 361/716 |
| 2006/0096299 | A1 * | 5/2006 | Mamitsu | ............... | H01L 23/473 |
| | | | | | 62/3.2 |
| 2006/0284308 | A1 * | 12/2006 | Harada | ................. | H01L 25/072 |
| | | | | | 257/729 |
| 2011/0299243 | A1 * | 12/2011 | Yamaura | ........... | H05K 7/20927 |
| | | | | | 361/688 |

(Continued)

FOREIGN PATENT DOCUMENTS

| JP | 2012-231591 A | 11/2012 |
| JP | 2013-030579 A | 2/2013 |

(Continued)

*Primary Examiner* — David M Sinclair
*Assistant Examiner* — Robert Brown
(74) *Attorney, Agent, or Firm* — Dinsmore & Shohl LLP

(57) ABSTRACT

With respect to a stack unit in which a plurality of power cards and a plurality of coolers are stacked, each of the plurality of power cards housing semiconductor element, a technique for improving the fitting of a stack unit to a housing is taught. A stack unit is a unit that coolers and power cards are stacked. An outer frame binds a stack of the power cards and the coolers. The outer frame pressurizes the stack along with the stacked direction. Each of the coolers comprises a main body and a metal plate. The main body includes a flow channel of coolant and an opening provided at a position facing the power card. The metal plate has one surface closing the opening. A seal between the opening and the metal plate is secured by pressure of the outer frame.

4 Claims, 6 Drawing Sheets

(56) References Cited

U.S. PATENT DOCUMENTS

| | | | | |
|---|---|---|---|---|
| 2013/0058068 A1* | 3/2013 | Funatsu | ............ | H05K 7/20927 361/820 |
| 2013/0264891 A1* | 10/2013 | Sawada | ................ | H02M 3/00 307/147 |
| 2013/0272043 A1* | 10/2013 | Sano | .................... | H02M 7/003 363/123 |
| 2013/0335918 A1* | 12/2013 | Tachibana | ............ | H05K 5/0213 361/689 |
| 2014/0313671 A1* | 10/2014 | Sugita | ............... | H05K 7/20927 361/700 |
| 2016/0073556 A1* | 3/2016 | Nakasaka | .......... | H05K 7/20927 361/699 |
| 2016/0106011 A1* | 4/2016 | Mizuno | ............. | H05K 7/20927 361/699 |
| 2016/0157381 A1* | 6/2016 | Takeuchi | ........... | H05K 7/20927 361/709 |
| 2016/0227677 A1* | 8/2016 | Hirasawa | .......... | H05K 7/20927 |

FOREIGN PATENT DOCUMENTS

| | | |
|---|---|---|
| JP | 2013-121236 A | 6/2013 |
| JP | 2015-213143 A | 11/2015 |

\* cited by examiner

STACK UNIT

CROSS-REFERENCE TO RELATED APPLICATION

This application claims priority to Japanese Patent Application No. 2014-259798 filed on Dec. 24, 2014, the contents of which are hereby incorporated by reference into the present application.

TECHNICAL FIELD

This specification discloses a stack unit including a plurality of power cards and a plurality of coolers that are stacked, each of the plurality of power cards housing a semiconductor element.

DESCRIPTION OF RELATED ART

A stack unit in which a plurality of power cards each of which houses a semiconductor element and a plurality of coolers are stacked is known. Each of the coolers is in contact with a corresponding one of the power cards. Such a stack unit provides efficient cooling of a large number of semiconductor elements by integrating the semiconductor elements. Such a stack unit is employed, for example, in an inverter that supplies power to a traction motor in an electric vehicle (as disclosed in Japanese Patent Application Publication No. 2013-121236 and Japanese Patent Application Publication No. 2012-231591). In a stack unit disclosed in Japanese Patent Application Publication No. 2012-231591, plate springs pressurize the stack unit in its stacking direction in order to enhance close contact of a power card with a cooler. The stack unit is supported while keeping pressurized between the plate springs and internal walls of a housing accommodating the stack unit.

SUMMARY

A stack unit employing characteristic coolers is shown in (Japanese Patent Application No. 2014-189299 filed on Sep. 17, 2014, not published when the present specification is filed). Each of the coolers includes a main body and a metal plate. The main body includes a flow channel for coolant inside the main body and an opening communicating with the flow channel at a position facing a corresponding power card. A metal plate closes the opening. Each power card is in contact with an external face of the corresponding metal plate. This stack unit is pressurized in its stacking direction. Accordingly, the pressure secures a seal between each opening and the corresponding metal plate and also enhances the close contact between each of the coolers (i.e., metal plate) and the corresponding power card.

The stack unit can also be pressurized by using plate springs in a housing, as with the stack unit described in Japanese Patent Application Publication No. 2012-231591. However, in the stack unit, the seal between each of the cooler main bodies and the corresponding metal plate is secured by pressure in the stacking direction. Therefore, the stack unit and the plate springs must be fitted in the housing while attention is paid for securing the seal between each of the cooler main bodies and the corresponding metal plate. This specification relates to improvements to the stack unit, and provides a technique for improving the fitting of the stack unit to the housing.

The stack unit disclosed by this specification comprises an outer frame binding a plurality of power cards and a plurality of coolers while pressurizing them in the stacking direction. The seal between the opening of each cooler main body and the corresponding metal plate is secured by pressure applied from the outer frame. This stack unit is excellent in fitting performance to a housing because the stack unit is capable of keeping a pressurized state before being incorporated in the housing. Details and further improvements in the technique disclosed by this specification will be described in "EMBODIMENT" below.

EMBODIMENT

Figure 1:
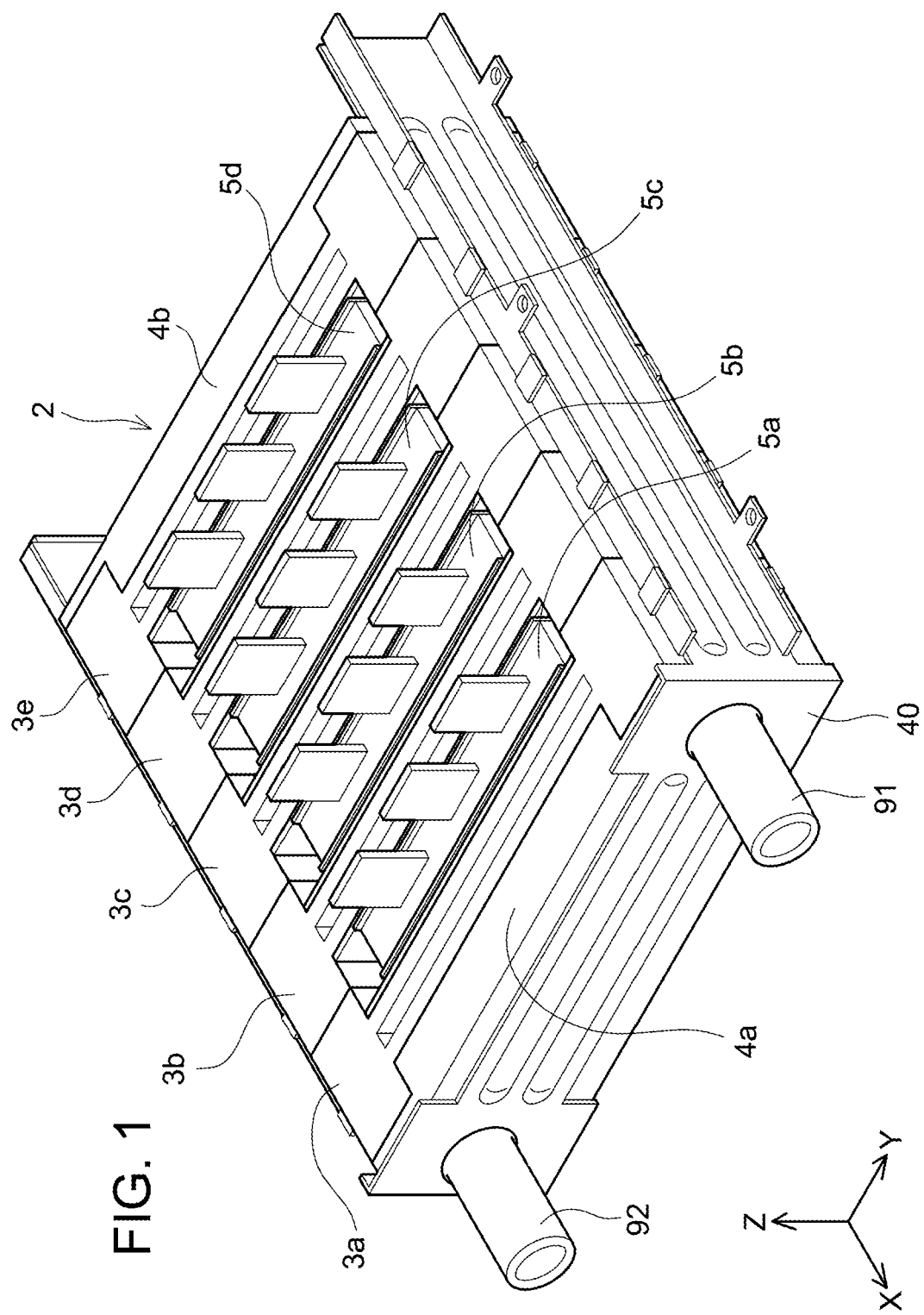
FIG. 1 is a perspective view of a stack unit according to an embodiment.

Referring to the drawings, a stack unit according to an embodiment will be described. FIG. 1 shows a perspective view of a stack unit 2. The stack unit 2 in the embodiment is a main component of a power controller incorporated in an electric vehicle. The power controller includes a voltage converter configured to boost voltage outputted from a battery and an inverter configured to convert boosted DC (direct current) into AC (alternating current) and supply the AC to a traction motor. The voltage converter and inverter include many switching elements (semiconductor elements) having large heating value. The stack unit 2 provides efficient cooling of the many switching elements by integrating these.

As shown FIG. 1, the stack unit 2 is a unit in which a plurality of power cards 5a to 5d and a plurality of coolers 3a to 3e are stacked. An outer frame 40 surrounds a periphery of a stack of the power cards 5a to 5d and coolers 3a to 3e. The outer frame 40 binds the power cards 5a to 5d and coolers 3a to 3e together.

An X axis direction in the drawing corresponds to a stacking direction along which the power cards 5a to 5d and the coolers 3a to 3e are stacked. This direction will be used in the same manner also in subsequent drawings. Hereinafter, any one of the power cards 5a to 5d may be referred to as "a power card 5" if any one of the plurality of the power cards 5a to 5d may be referred to without distinction among them. Additionally, any one of the coolers 3a to 3e may be referred to as "a cooler 3" if any one of the plurality of the coolers 3a to 3e may be referred to as without distinction among them. Hereinafter, for convenience of explanation, a positive direction of a Z axis may be referred to as "upward", a negative direction of the Z axis may be referred to as "downward" and a Y axis direction may be referred to as "lateral direction."

The plurality of power cards 5 and the plurality of coolers 3 are alternately stacked one by one. Two coolers 3 are respectively in contact with both sides of each power card 5, i.e., with one cooler 3 being in contact with one side of each power card 5, the other cooler 3 being in contact with the other side of the power card 5. Each of the coolers 3b to 3d has both faces each in contact with the corresponding power card 5. Each of the coolers 3a and 3e located at both ends in the stacking direction has only one face in contact with the corresponding power card 5. A front end cover 4a having a coolant supply pipe 91 and a coolant discharge pipe 92 is attached to the face of the cooler 3a, with which no power card 5 is in contact. A rear end cover 4b is attached to the face of the cooler 3e, with which no power card is in contact. The plurality of coolers 3 and the plurality of power cards 5, including the front end cover 4a and rear end cover 4b, are surrounded and bound by the outer frame 40.

Although described in detail below, each cooler 3 has through-holes at both ends thereof in the Y axis direction in the drawings. Each through-hole extends through the corresponding cooler 3 in the stacking direction (in the X axis direction). The through-holes are connected to a flow channel of coolant extending in the corresponding cooler 3 in parallel with the power cards 5. Coolant supplied from the coolant supply pipe 91 provided in the front end cover 4a flows in all the coolers via the through-holes located on one end in the Y axis direction. The coolant is liquid, typically water or LLC (Long Life Coolant). While passing through the flow channel of each of coolers 3, the coolant absorbs heat from the corresponding power cards 5 adjacent to the cooler 3. Thereafter, the coolant is discharged from the coolant discharge pipe 92 provided in the front end cover 4a, via the other of the through-holes.

Figure 2:
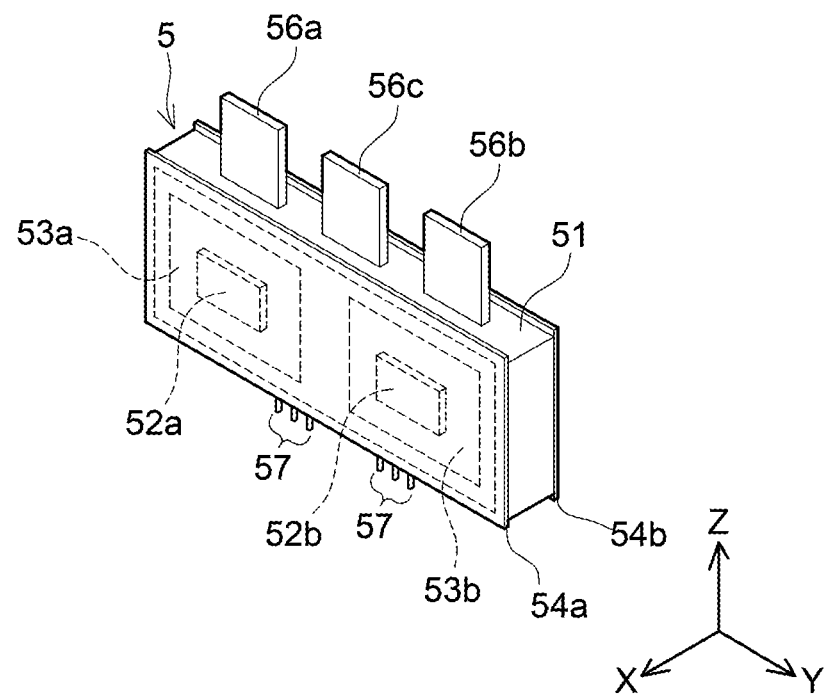
FIG. 2 is a perspective view of a power card.

Next, a structure of each power card 5 is described. FIG. 2 is a perspective view of the power card 5. The power card 5 is a device in which semiconductor elements 52a, 52b are sealed in a resin package 51. The semiconductor elements 52a, 52b are transistors (IGBTs) and are connected in series within the package 51. The connection of semiconductor elements 52a, 52b in series is hereinafter referred to as a series-circuit. Three power terminals 56a to 56c extend from an upper side of the package 51. The power terminal 56a is connected to one end of the series-circuit within the package 51, whereas the power terminal 56b is connected to the other end of the series-circuit. The power terminal 56c is connected to a midpoint of the series-circuit within the package 51. A plurality of control terminals 57 extend from a lower side of the package 51. The control terminals 57 include terminals connected to gate terminals of the semiconductor elements 52a, 52b, a terminal connected to a sense emitter, terminals connected to temperature sensors incorporated in the semiconductor elements 52a, 52b and the like.

Heat sinks 53a, 53b are arranged on both surfaces of each package 51. The heat sink 53a is a part of the power terminal 56a. That is, in FIG. 2, a portion indicated by symbol 56a and a portion indicated by symbol 53a are connected within the package 51. Similarly, the heat sink 53b is a part of the power terminal 56b. Similar heat sinks are also arranged on the other face of the package 51, opposite to a face on which the heat sinks 53a, 53b are arranged. These heat sinks are a part of the power terminal 56c. Hereinafter, any of the semiconductor elements 52a, 52b may be referred to as a semiconductor element 52 if any one of the semiconductor elements 52a, 52b may be indicated without distinction. Any of the heat sinks 53a, 53b and heat sinks opposite them may be referred to as a heat sink 53 if any one of the heat sinks 53a, 53b and heat sinks opposite them may be indicated without distinction.

Two coolers 3 are respectively in contact with both sides of the power card 5 in the X axis direction in FIG. 1, i.e., with one cooler 3 being in contact with one side of each power card 5, the other cooler 3 being in contact with the other side of the power card 5. As described below, the cooler 3 includes metal plates 13 (metal plate 13a and metal plate 13b) on faces each of which facing the corresponding power card 5. Therefore, in order to insulate the heat sinks 53a, 53b from the corresponding metal plates 13, an insulating plate Ma is attached to the surface of the package 51 so as to cover the heat sinks 53a, 53b. An insulating plate 54b is attached to the other surface of the package 51, which is opposite the surface to which the insulating plate 54a is attached. The insulating plate 54b insulates the heat sinks (not shown) arranged on the other surface of the package 51, which are opposite to the surface on which the heat sinks 53a, 53b are arranged, from the metal plate 13 of the cooler 3, which faces the heat sinks (not shown). Hereinafter, any of the insulating plates 54a, 54b may be referred to as an insulating plate 54 if any one of the insulating plates 54a, 54b may be indicated without distinction. Heat of the semiconductor elements 52 incorporated in each package 51 is absorbed by the corresponding cooler 3 adjacent to the power card 5 through the corresponding heat sink 53 and insulating plate 54. The insulating plate 54 may be bonded to each package 51 or may simply be held between the package 51 and the adjacent cooler 3 within the stack unit 2. Even in a case where the insulating plate 54 is separable from each package 51, the insulating plate 54 is regarded as a component of the power card 5 in this specification.

Figure 3:
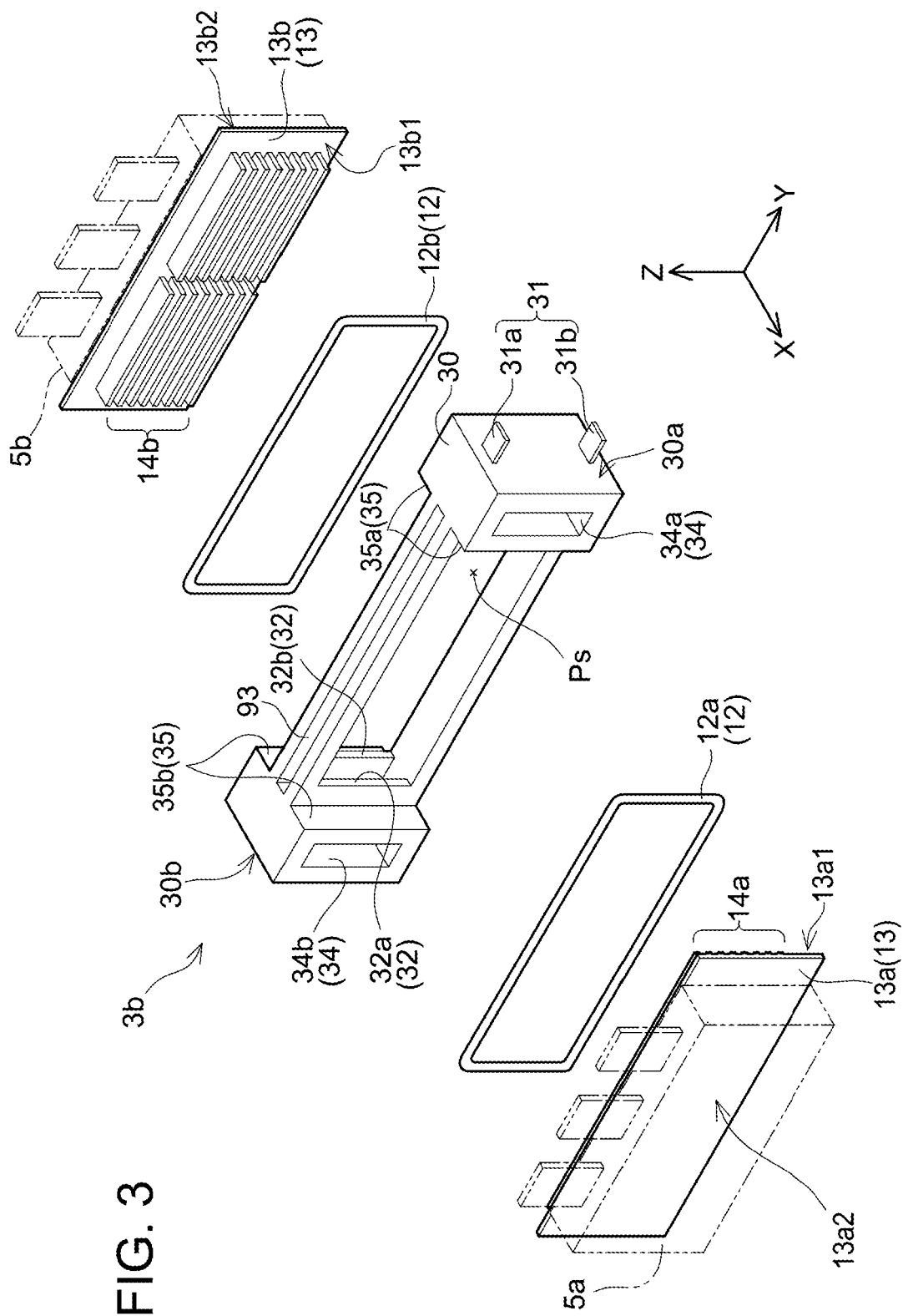
FIG. 3 is an exploded perspective view of a cooler.

Next, a structure of each cooler 3 will be described. The coolers 3a to 3e have a same structure. Here, the cooler 3b is described as a representative of the coolers 3. FIG. 3 is an exploded perspective view of the cooler 3b. In FIG. 3, the power cards 5a, 5b located on both sides of the cooler 3b in the stacking direction are shown by imaginary lines. The cooler 3b includes a body 30 made of resin, a pair of metal plates 13a, 13b, and a pair of gaskets 12a, 12b. A flow channel Ps in which coolant flows is provided within the body 30. In the body 30, openings 32a, 32b are provided in positions facing the corresponding power cards 5 on both sides of the body 30. The openings 32a, 32b communicate with the flow channel Ps inside the main body. Reference numeral 93 indicates a groove for weight reduction. Although not shown in FIG. 3, another groove for weight reduction is also provided in a side face of the body 30 opposite to a face on which the groove is provided. Although the body 30 has a complicated shape as described above, the body 30 can be formed at a low cost by resin injection molding. Additionally, the body 30 is lightweight as it is made of resin.

The one opening 32a of the body 30 is closed by the metal plate 13a with the gasket 12a interposed between the opening 32a and the metal plate 13a. The other opening 32b is closed by the metal plate 13b with the gasket 12b interposed between the other opening 32b and the metal plate 13b. A plurality of fins 14a is provided on one surface 13a1 of the metal plate 13a that faces the flow channel. The other surface 13a2 of the metal plate 13a, opposite the one surface 13a1, faces the power card 5a. A plurality of fins 14b is provided on one surface 13b1 of the metal plate 13b that faces the flow channel. The other surface 13b2 of the metal plate 13b, opposite the one surface 13b1, faces the power card 5b. When the cooler 3b is incorporated in the stack unit 2, the metal plate 13a comes into contact with the power card 5a and the metal plate 13b comes into contact with the power card 5b. A seal between the opening 32a (32b) and the metal plate 13a (13b) is secured by pressure applied from the outer frame 40, via the gasket 12a (12b). Accordingly, the fins 14a of the metal plate 13a and the fins 14b of the metal plate 13b are disposed in a flow of the coolant. The heat of the power card 5a is absorbed by the coolant via the metal plate 13a and the fins 14a provided thereon. The heat of the power card 5b is absorbed by the coolant via the metal plate 13b and the fins 14b provided thereon. In the cooler 3b, its body 30 is made of resin whose heat conductivity is not high. However, the cooler 3b has the metal plate 13a (13b) one side of which is in contact with the power card 5a (power card 5b) and the other side of which is in contact with the coolant. Accordingly, the cooler 3b secures high cooling performance Any of the openings 32a, 32b may be referred to as an opening 32 if any one of the openings 32a, 32b may be indicated without distinction. Any of the metal plates 13a, 13b may be referred to as a metal plate 13 if any one of the metal plates 13a, 13b may be indicated without distinction.

The body 30 is horizontally long in the Y axis direction, and has at both ends in the Y axis direction, hollow parts 35a, 35b. Any of the hollow parts 35a, 35b may be referred to as a hollow part 35 if any one of the hollow parts 35a, 35b may be indicated without distinction. The cylindrical part 35 extends along the stacking direction. A through-hole 34 (34a, 34b) extending along the stacking direction is provided in the hollow part 35. Coolant supplied from the through-hole 34a of the one hollow part 35a flows in the flow channel Ps in the Y axis direction and is discharged from the through-hole 34b of the other hollow part 35b. The coolant flows along the Y axis direction in the drawings. In the stack unit 2, the through-holes 34 of each cooler 3 and the through-holes 34 of the adjacent cooler 3 communicate with each other. The coolant supplied from the coolant supply pipe 91 (see FIG. 1) is distributed to all the coolers 3 via the through-holes 34a. The coolant having passed through the corresponding flow channels Ps of the coolers 3 gathers via the other through-holes 34b and is discharged from the coolant discharge pipe 92 (see FIG. 1).

A side surface 30a of the body 30 that is oriented in the Y axis direction has projections 31a, 31b. The projections 31a, 31b are provided for restricting movement of the outer frame 40 in an up-and-down direction (in the Z axis direction) (See FIG. 1). The projections 31a, 31b are connected in the body 30, and a combination of them is referred to as a projecting piece 31. Similarly, a side surface 30b opposite the side surface 30a has another two projections (projecting piece).

Figure 4:
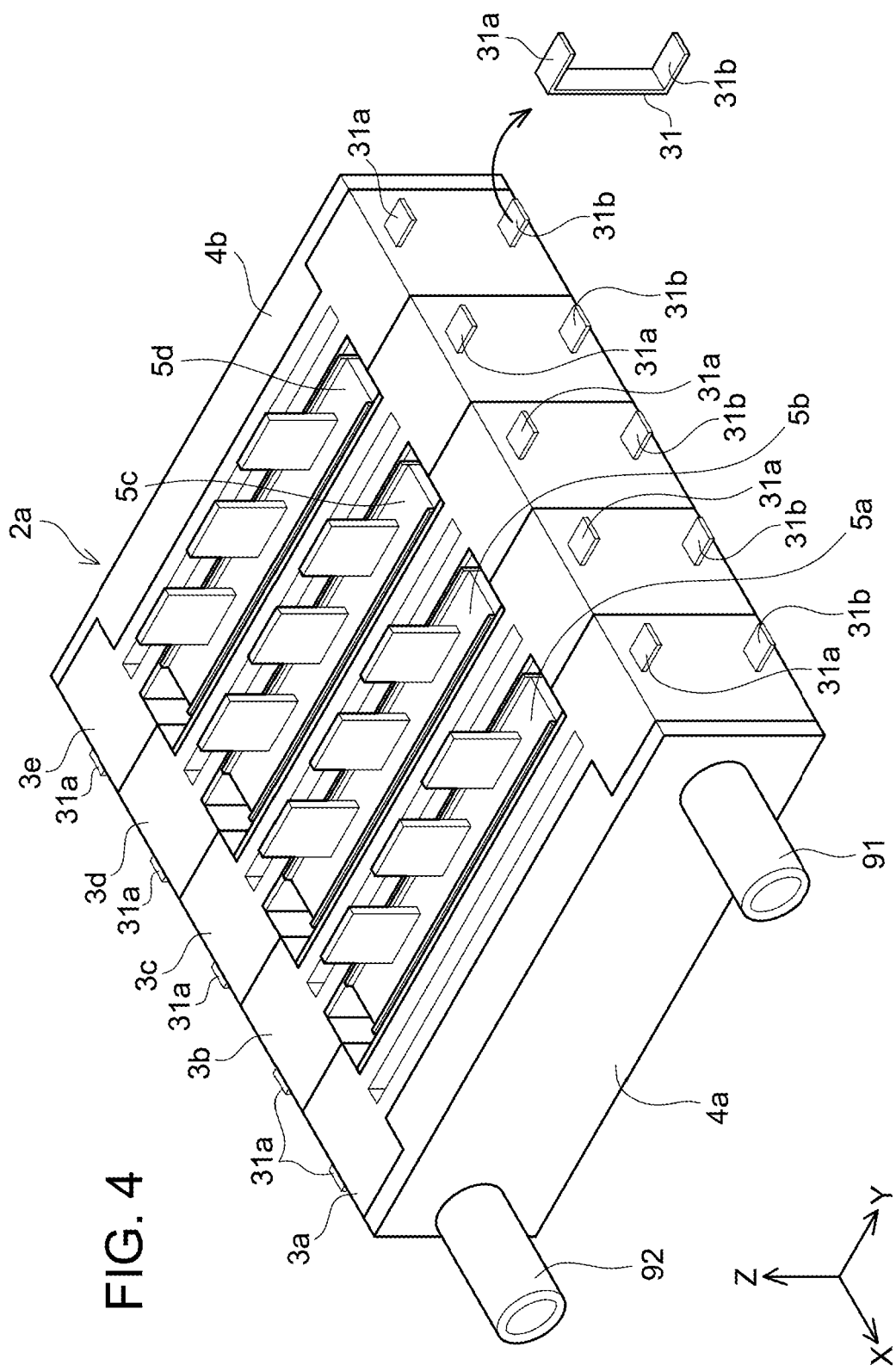
FIG. 4 is a perspective view of a stack including the power cards and coolers.

FIG. 4 is a perspective view of the stack unit 2 without the outer frame 40. Hereinafter, for convenience of description, the stack unit 2 without the outer frame 40 is referred to as a stack 2a. The stack 2a includes the plurality of power cards 5 and the plurality of coolers 3 that are stacked. FIG. 4 also shows the projecting pieces 31. Each of the coolers 3a, 3c to 3e has the same structure as the cooler 3b. However, the front end cover 4a, instead of the power card 5, is in contact with one of faces of the cooler 3a located at one end of the stack unit 2 in the stacking direction. Likewise, the rear end cover 4b, instead of the power card 5, is in contact with one of the faces of the cooler 3e located at the other end of the stack unit 2 in the stacking direction. The front end cover 4a covers the opening 32a (see FIG. 3) provided in the body 30 of the cooler 3a. The front end cover 4a also covers one open ends of the through-holes 34a, 34b (see FIG. 3) provided in the body 30 of the cooler 3a. Further, the coolant supply pipe 91 and coolant discharge pipe 92 are provided in the front end cover 4a. The rear end cover 4b covers the opening 32b (see FIG. 3) provided in the body 30 of the cooler 3e. Additionally, the rear end cover 4b also covers the other open ends of the through-holes 34a, 34b (see FIG. 3) provided in the body 30 of the cooler 3e.

Figure 5:
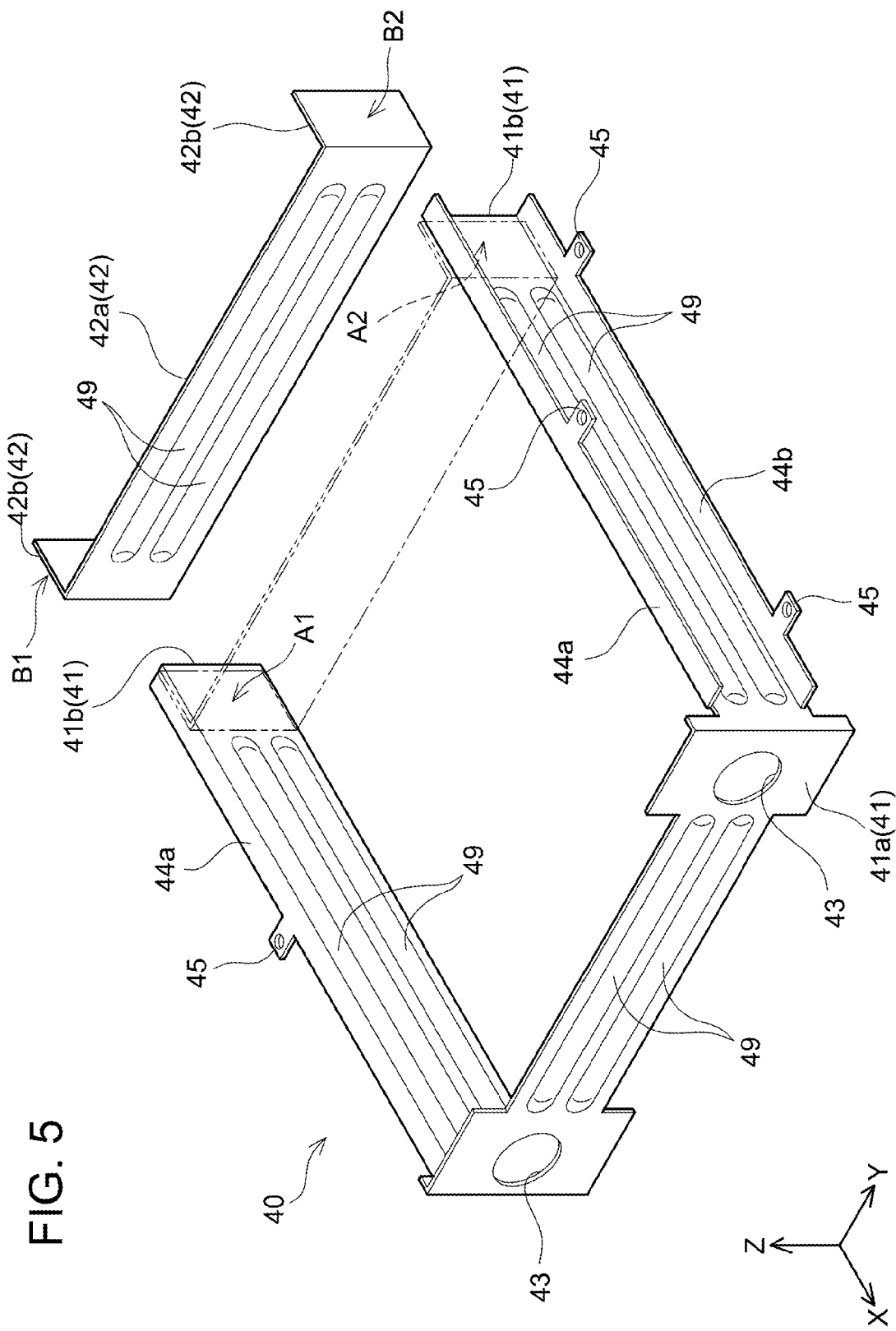
FIG. 5 is a perspective view of an outer frame.

FIG. 5 shows a perspective view of the outer frame 40. The stack unit 2 is completed by attaching the outer frame 40 to the stack 2a shown in FIG. 4. The outer frame 40 includes a U-shaped part 41 surrounding three sides of the stack 2a, and a connection part 42 connecting both ends of the U-shaped part 41. In FIG. 5, the U-shaped part 41 and connection part 42 are separately shown. Dashed-two dotted lines indicate the connection part 42 connected to the U-shaped part 41.

The U-shaped part 41 includes a front plate 41a corresponding to a bottom of a letter U and two side plates 41b corresponding to both arms of the letter U. From both ends of the front plate 41a, the side plates 41b extend along a direction orthogonal to a plate face of the front plate 41a, thus forming the U letter shape as a whole. The front plate 41a and side plates 41b are made of a single steel plate. The U-shaped part 41 is made by press working.

The front plate 41a is in contact with the front end cover 4a of the stack 2a. The front plate 41a has holes 43 through which the coolant supply pipe 91 and coolant discharge pipe 92 of the front end cover 4a are passed.

The side plates 41b are in contact with the corresponding side faces of the stack 2a. The side faces of the stack 2a are a face formed by connection of the side surfaces 30a (of the coolers 3) that are oriented in the Y axis direction and a face formed by connection of the side surfaces 30b (of the coolers 3) that are oriented in the Y axis direction (see FIG. 3). Upper and lower edges of each of the side plates 41b have ribs 44a, 44b, respectively. The rib 44a is in contact with the corresponding projections 31a of the coolers 3. The rib 44b is in contact with the corresponding projections 31b of the coolers 3. The corresponding projections 31a, 31b of the coolers 3 sandwich the side plates 41b from above and below, thereby restricting a position of the outer frame 40 along the up-and-down direction. It should be noted that the projections 31a (31b) and ribs 44a (44b) are welded. The ribs 44a (44b) and projections 31a (31b) are welded after the U-shaped part 41 and connection part 42 are joined. The joining of the U-shaped part 41 and connection part 42 is described below. The ribs 44a, 44b enhances a strength of the side plates 41b. Additionally, the ribs 44a, 44b have tabs 45 for fixing the outer frame 40 to a housing (not shown) of the power controller.

Long protrusions 49 are provided on the front plate 41a and side plates 41b along its respective longitudinal directions of the front plate 41a and side plates 41b. The protrusions 49 are provided to enhance strengths of the front plate 41a and side plates 41b. The protrusions 49 are simultaneously formed when the U-shaped part 41 is subjected to press working.

The connection part 42 will now be described. The connection part 42 is made of a steel plate, and both ends 42b of a rear plate 42a are bent at right angle. The rear plate 42a of the connection part 42 also has long protrusions 49 along its longitudinal direction. The protrusions 49 are also provided to enhance a strength of the connection part 42.

The connection part 42 connects both ends of the U-shaped part 41. The inner side faces A1, A2 of the U-shaped part 41 at both ends is joined by welding with outer side faces B1, B2 at the ends 42b of the connection part 42 that are bent at right angle, thereby completing the outer frame 40.

How the outer frame 40 and the stack 2a are fitted together will now be described. For convenience of explanation, a face of the stack 2a that is oriented to a positive direction of the X axis is referred to as a "front face", both faces of the stack 2a that are oriented in the Y axis direction are referred to as "side faces", and a face of the stack 2 that is oriented to a negative direction of the X axis is referred to as a "rear face".

The U-shaped part 41 of the outer frame 40 is fitted to the stack 2a. At this stage, the plurality of coolers 3, the plurality of power cards 5, the front end cover 4a and the rear end cover 4b of the stack 2a are only temporarily fixed, and the seal between each opening 32 and the corresponding metal plate 13 is incomplete. After the U-shaped part 41 is fitted to the stack 2a, the connection part 42 is pressed against a rear face of the stack 2a. In this state, the stack 2a with the U-shaped part 41 and the connection part 42 is pressurized in the stacking direction. Pressure is applied by an assembling machine (not shown). The assembling machine applies pressure to the stack 2a until each seal between each opening 32 and the corresponding metal plate 13 is completed. After the seal between each opening 32 and the corresponding metal plate 13 is obtained, both ends of the U-shaped part 41 and the connection part 42 are joined. As described above, the U-shaped part 41 and the connection part 42 are joined by welding. By joining the U-shaped part 41 and the connection part 42, the pressure on the stack 2a is retained by the outer frame 40 (i.e., the U-shaped part 41 and connection part 42) even when the pressure by the assembling machine is released. The seal between each opening 32 and the corresponding metal plate 13 is retained by pressure applied from the outer frame 40. Thereafter, the projections 31a (31b) provided on the corresponding side surfaces of the coolers 3 are welded to the ribs 44a (44b) of the U-shaped part 41. Thus, a stack unit 2 in which the stack 2a is pressurized in the stacking direction by the outer frame 40 is completed. In the stack unit 2, the outer frame 40 retains the pressurized state of the stack 2a in the stacking direction. In the stack unit 2, the seal between each opening 32 of each cooler 3 and the corresponding metal plate 13 are secured by the outer frame 40.

Figure 6:
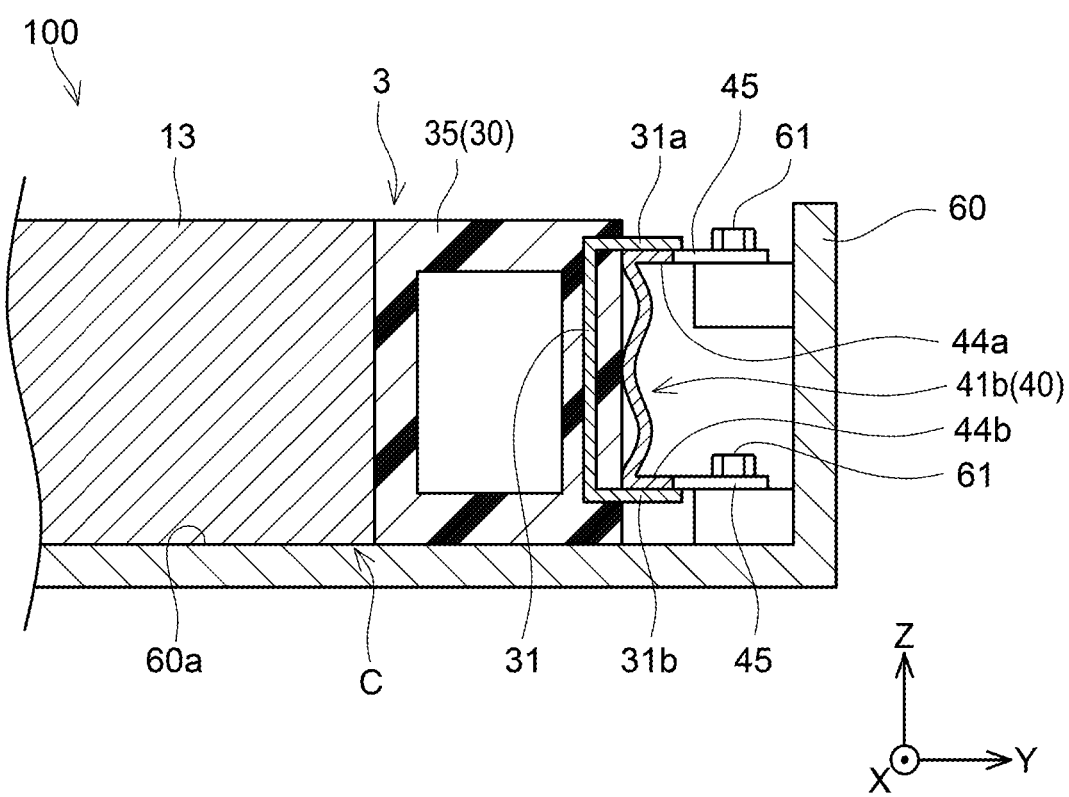
FIG. 6 is a partial sectional view of the stack unit attached to a housing.

The stack unit 2 is attached to the housing of the power controller. Before being attached to the housing, the stack 2a of the plurality of power cards 5 and the plurality of coolers 3 has retained in the pressurized state by the outer frame 40. The seal between each of the opening 32 and the corresponding metal plate 13 is also secured by the outer frame 40. Thus, the stack unit 2 is easily attached to the housing. Referring to FIG. 6, an example of a relation between a housing 60 of the power controller and the stack unit 2 will now be described. FIG. 6 is a partial sectional view of the stack unit 2 attached to the housing 60 of the power controller. FIG. 6 shows a part of the housing 60 and the stack unit 2 and the other components of the power controller are not shown. FIG. 6 shows a section passing through a metal plate 13 of one cooler 3. FIG. 6 shows a right half of the stack unit 2. A left half has the same structure as the right half. Further, in FIG. 6, the power terminals 56a and so on and the control terminals 57 of the power card 5 are not shown, either.

As shown in FIG. 6, the projection 31a provided on the side surface of the cooler 3 and the rib 44a provided on the side plate 41b of the outer frame 40 are in contact with each other and they are welded together. Similarly the projection 31b and the rib 44b are in contact with each other and they are welded together. The stack unit 2 is fixed to the housing 60 by bolts 61 through the tabs 45 extending respectively from the ribs 44a and 44b of the outer frame 40. Because the seal between each opening 32 and the corresponding metal plate 13 in the stack unit 2 is secured by the outer frame 40, the stack unit 2 may easily be attached to the housing 60 by simply tightening the bolts 61.

A lower face (face oriented to the negative direction of the Z axis) of the stack unit 2 is in contact with a bottom face 60a of the housing 60. As indicated by an arrow C in FIG. 6, the metal plate 13 of the cooler 3 and the bottom face 60a of the housing 60 are in contact with each other. It should be noted that the housing 60 is made of metal. Therefore, the metal plates 13 connect electrically with the housing 60. As described above, the corresponding heat sink 53 of each power card 5 connects electrically with the corresponding semiconductor element 52. Therefore, the heat sink 53, the metal plate 13, and the insulating plate 54 sandwiched between the heat sink 53 and the metal plate 13 form a capacitor. Switching noise generated by the semiconductor element 52 is guided to the housing 60 through the capacitor. Since the housing 60 is mounted in a body of a vehicle, the switching noise generated by the semiconductor element 52 is guided to the body of the vehicle. The switching noise generated by the semiconductor element 52 flows from the corresponding heat sink 53 of the corresponding power card 5 to the body of the vehicle through the corresponding metal plate 13 and the housing 60. This can reduce influence that switching noise generated by the semiconductor element 52 works on other electric devices.

Points to be noted regarding the technique described in the embodiment will now be described. The U-shaped part 41 and the connection part 42 of the outer frame 40 are joined by welding. Alternatively, the U-shaped part and the connection part may be fixed by another fixing means such as a bolt. The outer frame 40 in the embodiment is configured of the U-shaped part 41 and connection part 42. Alternatively, a U-shaped frame may be employed as a connection part. For example, two U-shaped frame parts are disposed so as to face each other, and then the stack may be sandwiched between the two U-shaped frame parts facing each other.

The plurality of the coolers 3a to 3e has a same structure. The front end cover 4a and the rear end cover 4b are respectively attached to the coolers 3a and 3e at the ends. In the stack unit, coolers at the ends in the stacking direction may be different in shape from the other coolers. Typically, a cooler formed by integrating the cooler 3a at one end in the stacking direction with the front end cover 4a may be employed. Similarly, a cooler formed by integrating the cooler 3e at the other end in the stacking direction with the rear end cover 4b may be employed. In this case, each of the remaining coolers other than the coolers at both ends in the stacking direction has the structure as shown in FIG. 3.

Specific examples of the present specification has been described in detail, however, these are mere exemplary indications and thus do not limit the scope of the claims. The art described in the claims include modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

What is claimed is:
1. A stack unit comprising:
    a plurality of power cards, each of the plurality of power cards housing a semiconductor element;
    a plurality of coolers stacked with the plurality of power cards, each of the plurality of coolers being in contact with a corresponding one of the plurality of power cards; and
    an outer frame binding a stack of the power cards and the coolers, the outer frame pressurizing the stack in a stacking direction along which the power cards and the coolers are stacked, the outer frame includes an upper side edge and a lower side edge, and ribs extend outwardly from the upper side edge and the lower side edge;

wherein each of the plurality of coolers comprises:

a main body including a flow channel of coolant inside the main body, and an opening provided at a position facing the corresponding power card, the opening communicating with the flow channel, the main body includes projections provided on a side surface of the main body being in contact with the outer frame, the projections restrict a position of the outer frame along an up-and-down direction, an inner surface of the projections contacts an outer surface of the ribs; and a metal plate having one surface closing the opening, and the other surface being in contact with the corresponding power card, and a seal between each of the openings and the corresponding metal plate is secured by pressure applied from the outer frame.

2. The stack unit according to claim 1, wherein the outer frame is configured by a U-shaped part and a connection part connecting both ends of the U-shaped part.

3. The stack unit according to claim 1, wherein the ribs and the projections are welded after the U-shaped part and the connection part are joined.

4. The stack unit according to claim 1, wherein a gasket is positioned between each of the openings and the corresponding metal plate.

* * * * *